United States Patent [19]

Benincasa

[11] 4,417,170

[45] Nov. 22, 1983

[54] FLEXIBLE CIRCUIT INTERCONNECT FOR PIEZOELECTRIC ELEMENT

[75] Inventor: Timothy C. Benincasa, Bellevue, Ohio

[73] Assignee: Imperial Clevite Inc., Rolling Meadows, Ill.

[21] Appl. No.: 323,913

[22] Filed: Nov. 23, 1981

[51] Int. Cl.³ .................................................. H01L 41/04
[52] U.S. Cl. ........................................ 310/345; 310/344; 310/348; 310/369
[58] Field of Search ............... 310/340, 344, 345, 348, 310/369; 174/117 FF, 117 PC; 361/398–399

[56] References Cited

U.S. PATENT DOCUMENTS

| | | | |
|---|---|---|---|
| 2,540,101 | 2/1951 | Colman | 174/117 FF |
| 2,703,854 | 3/1955 | Eisler | 174/117 FF |
| 3,079,458 | 2/1963 | Hedstrom | 174/117 FF |
| 3,495,103 | 2/1970 | Nakajima et al. | 310/369 X |
| 3,885,173 | 5/1975 | Lee | 310/345 X |
| 3,980,911 | 9/1976 | English | 310/348 |

*Primary Examiner*—Peter S. Wong
*Attorney, Agent, or Firm*—Russell E. Baumann

[57] ABSTRACT

A piezoelectric assembly with a flexible circuit interconnect is provided. The flexible circuit interconnect is comprised of a first flexible insulating base film including spaced electrically conductive circuit traces, a second flexible insulating film disposed over a portion of the first base film and a segment of the traces, and means for electrically connecting the traces to an electrical circuit. Also provided is a method for manufacturing a flexible circuit interconnect for a piezoelectric element comprising laminating spaced circuit traces on a flexible insulating base material to define a contact arrangement with a first set of terminal ends of the traces; attaching termination electrical connectors at a second set of terminal ends of the traces; mounting an insulating overlay to the base material for insulating a portion of the traces and electrical connectors; and, mounting a piezoelectric element to the contact arrangement.

3 Claims, 5 Drawing Figures

FLEXIBLE CIRCUIT INTERCONNECT FOR PIEZOELECTRIC ELEMENT

BACKGROUND OF THE INVENTION

This invention pertains to the art of electric interconnect devices and, more particularly, to flexible circuit interconnects.

The invention is particularly applicable to connecting a piezoelectric element or piezo-generator to an electric circuit such as a printed circuit board. However, it will be appreciated by those skilled in the art that the invention could be readily adapted for use with other devices as, for example, where similar flexible circuit interconnects are employed for electrical interconnection.

Piezoelectric elements are typically ceramic devices which produce an electric voltage across the element upon physical deformation. Such elements may be advantageously employed as a piezoelectric transducer in a low tire warning system as is disclosed in U.S. Pat. No. 4,237,728.

Conventional methods for interconnecting a piezoelectric element include use of multiple conventional stamped metal contacts combined with an insulating ring of suitable insulating material. The stamped metal contacts are attached at opposed ends of the piezoelectric element to provide secure interconnections. Typically, the piezoelectric element sits on top of a thin, metallic lower contact with an insulating ring placed adjacent the top portion of the piezoelectric element to insulate the lower contact from an upper contact. The upper contact is then placed over the top of the insulating ring while maintaining an electrically operative connection to a face of the element. The two metallic contacts are extended out beyond the piezoelectric element and connected to the required circuit. In typical applications it is necessary to secure the extended metal contacts with conventional soldering techniques to small diameter pins mounted on a printed circuit board.

An alternate prior art interconnection scheme includes the use of individual insulated hook-up wiring devices soldered to the appropriate contact areas of the piezoelectric element. A special silver-bearing, rosin flux wire soldering material is typically required for this technique.

The various prior art forms and types of circuit interconnects for piezoelectric elements that have heretofore been suggested and employed in the industry have met with varying degrees of success. It has been found that the defects present in most prior interconnects are such that the devices themselves have limited economic and practical value.

The metal contacts scheme in combination with an insulating ring for interconnecting piezoelectric elements has suffered a number of inherent problems. The scheme typically requires use of multiple parts necessitating additional tooling, substantially increased assembly time, and decreased reliabiity resulting from the use of multiple parts. Additionally, the cost of material and installation of the metal contact scheme is undesirable due to the plurality of parts.

The conventional hook-up wire interconnection scheme has suffered from the problems of requiring the use of a special silver-bearing solder and a special soldering technique. The special solder and technique has necessitated hand soldering installation resulting in a time-consuming, inefficient operation that requires considerable skill. The dependence on human technique necessarily encompasses considerable operator error, and ultimately reduced reliability of the interconnection. It has also required considerable inspection and testing procedures for quality control to identify unreliable connections. A particular additional problem of this technique is that the conductor size normally used is in the 0.010" diameter range. Such a small diameter provides little mechanical strength, especially when subject to the normal vibrations that a piezoelectric element experiences during operation. Handling of the device after the soldering operation has also been a particular problem due to the fragile leads.

The present invention contemplates a new and improved device which overcomes all of the above-referred to problems and others to provide a new flexible circuit interconnect for a piezoelectric element which is simple in design, economical to manufacture, readily adaptable to a plurality of uses with piezoelectric elements having a variety of dimensional characteristics, easy to install and which provides improved operational and electrical interconnection.

BRIEF SUMMARY OF THE INVENTION

In accordance with the present invention, there is provided an electrical interconnect particularly suited for connecting a piezoelectric element to an electrical circuit. The new interconnect is generally comprised of a first flexible insulating film including spaced electrically conductive circuit traces, a second flexible insulating film disposed over a portion of the first film and a segment of the traces and means for electrically connecting the traces to an electrical circuit.

In accordance with another aspect of the present invention, the portion of the first film over which the second flexible insulating film is disposed includes the segment of the circuit traces and the means for electrically connecting the segment to an electrical circuit. The portion is configured to extend away from a second portion of the first film.

In accordance with a further aspect of the present invention, the second portion of the first film includes at least two of the circuit traces, one of which is disposed along the periphery of the second portion and the second of which is disposed generally centrally of the second portion and the first circuit trace. The one and the second circuit traces further extend in electrical continuity onto the first portion of the first base film to the means for electrically connecting.

In accordance with a more limited aspect of the present invention, the second portion is generally circular in configuration and adapted to receive a disc-like piezoelectric element.

In accordance with the present invention there is provided a piezoelectric assembly comprising a piezoelectric element and a flexible interconnect for attachment to the element. The interconnect includes an insulating base, spaced circuit traces laminated to the base in operative electrical connection to the element and means for connecting the traces to an electrical circuit.

In accordance with another aspect of the present invention, the piezoelectric element is generally disc-shaped in configuration and includes a face for attachment to the flexible interconnect. The face is operatively connected to a first of the traces about a segment of the periphery of the face and operatively connected to a second of the traces generally centrally of the face.

In accordance with a further aspect of the present invention, the assembly further includes an insulating overlay sealing the circuit traces which are not electrically connected to the element. The overlay is disposed intermediate of the base and a portion of the piezoelectric element to preclude a short circuit between the first and the second of the traces at the periphery of the base.

In accordance with the present invention, there is provided a method for manufacturing a flexible circuit interconnect for a piezoelectric element comprising laminating spaced circuit traces on a flexible insulating base material to define a contact arrangement with the first set of terminal ends of the trace, attaching terminal electrical connectors at a second set of terminal ends at the traces, mounting an insulating overlay to the base material for insulating a portion of the traces and the electrical connectors, and mounting a piezoelectric element to the contact arrangement.

One benefit obtained by use of the present invention is a flexible circuit interconnect for a piezoelectric element which provides a dependent and simplified interconnect scheme between a piezoelectric generator and an electrical circuit.

Another benefit obtained with the present invention is a flexible circuit interconnect for a piezoelectric element which utilizes fewer parts, is easy to assembly, provides greater mechanical strength than prior interconnect schemes and obviates the costly manual operation required with prior interconnect schemes.

Other benefits and advantages for the subject new flexible circuit interconnect with become apparent to those skilled in the art upon a reading and understanding of this specification.

BRIEF DESCRIPTION OF THE DRAWINGS

The invention may take physical form in certain parts and arrangements of parts, the preferred embodiment of which will be described in detail in this specification and illustrated in the accompanying drawings which form a part hereof and wherein.

DETAILED DESCRIPTION OF THE INVENTION

Figure 5:
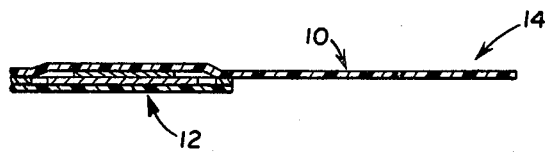
FIG. 5 is a cross-sectional view of the flexible interconnect in operative engagement with a piezoelectric element to form a piezoelectric generator assembly.

Referring now to the drawings wherein the showings are for purposes of illustrating the preferred embodiment of the invention only and not for purposes of limiting same, the FIGURES show a circuit interconnect 10 and a piezoelectric element 12. The element 12 is preferably attached to the circuit interconnect 10 to provide a piezoelectric assembly 14 (FIG. 5).

Figure 1:
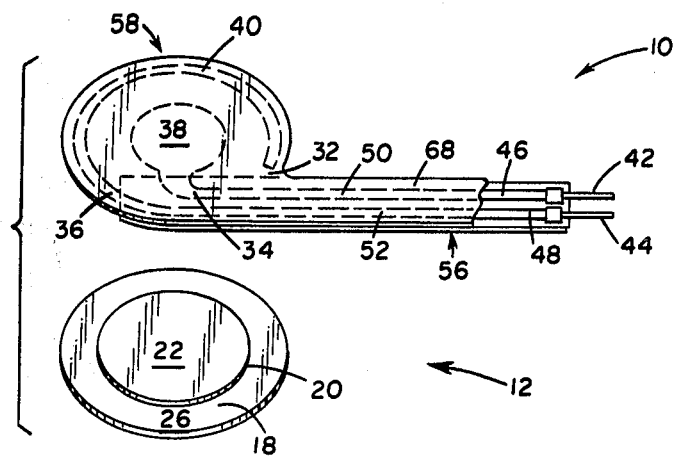
FIG. 1 is a perspective view of a flexible circuit interconnect for a piezoelectric element and a piezoelectric element positioned for ready attachment thereto formed in accordance with the present invention.
Figure 2:
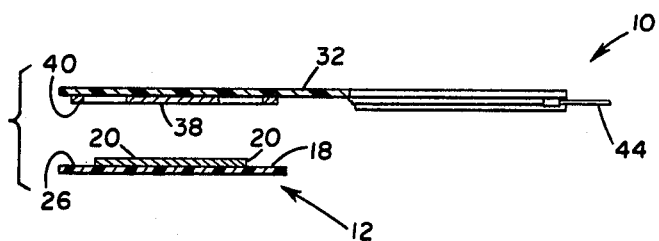
FIG. 2 is an elevational view in partial cross-section of the interconnect and element of FIG. 1.

More specifically and with reference to FIGS. 1 and 2, piezoelectric element 12 is of a conventional configuration and construction. The element 12 comprises a first base electrical contact 18, an intermediate piezoelectric element 20 and a second element top contact 22. Base contact 18 is preferably a solid brass disc having a diameter of approximately 1.06" and a depth of 0.01". Intermediate piezoelectric element 20 is preferably a conventional ceramic piezoelectric material similarly configured in a disc-like configuration but having a lesser diameter of approximately 0.80" to provide for a peripheral contact area 26 generally about the periphery of the face of base contact 18. The element top contact 22 preferably comprises a "fired-on" layer of silver. The element 12 has an overall depth of approximately 0.021".

The circuit interconnect 10 is preferably constructed of a flexible material to provide ease of installation and improved operation. The interconnect 10 comprises a first flexible insulating base film 32 preferably constructed of a thermoplastic dielectric material. Spaced circuit traces 34, 36 are laminated onto the base film 32 to define a contact arrangement for connection to the piezoelectric element 12 at a first set of terminal ends 38, 40 and to define circuit lines 50, 52 for electrical connection to conventional termination electroconnectors 42, 44 at a second set of circuit trace terminal ends 46, 48. The base film 32 includes a first portion 56 including the circuit line segments 50, 52 of the circuit traces 34, 36 and the electrical connectors 42, 44. First portion 56 extends away from the second portion 58 of base film 32 to facilitate connection of the piezoelectric assembly 14 (FIG. 5) to an electrical circuit (not shown). The second portion 58 of base film 32 includes the first set of terminal ends 38, 40 of the circuit traces 34, 36 disposed for defining the contact arrangement for electrical contact to the piezoelectric element 12. The contact arrangement is in electrical continuity with the circuit lines 50, 52 and the connectors 42, 44.

Circuit traces 34, 36 preferably comprise copper foil and are laminatd to the base film 32 and etched into the correct circuit trace pattern using known methods and techniques. The piezoelectric element contact arrangement preferably comprises the outer periphery contact area or terminal end 40 for electrical connection to the base contact area 26 of the element 12. The center contact area 38 is disposed generally centrally of the second portion 58 of base film 32 and is configured for electrical connection to the top contact area 22 of element 12. The contact areas 38, 40 preferably comprise exposed copper. The outer contact area 40 extends generally about the entire periphery of second portion 58 but is spaced from circuit trace 34 at an area of intersection between first portion 56 and second portion 58 to avoid short-circuiting of the outer contact area 40 to the center contact area 38 when the element 12 is connected to the interconnect 10. Outer periphery contact area 40 has a transverse dimension of approximately 0.062". The center contact area 38 has a diametrical dimension of approximately 0.5".

After circuit traces 34, 36 have been properly etched onto the base film 32, electrical termination connectors 42, 44 are secured to the second set of terminal ends 46, 48 of circuit traces 34, 36 to provide a reliable and convenient means to interconnect to an electrical circuit. Connectors 42, 44 preferably comprise conventional electrical connectors which may be compressed or solder attached to circuit traces 34, 36.

Figure 3:
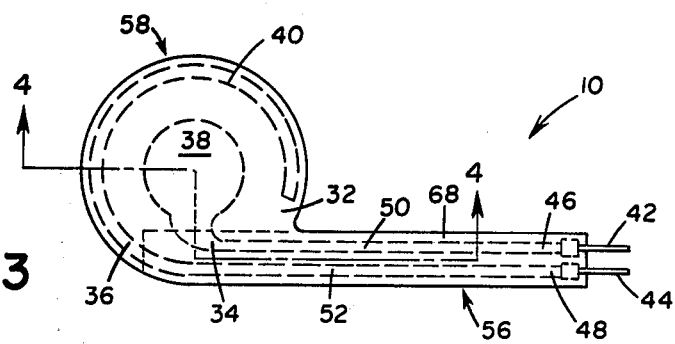
FIG. 3 is a plan view of a flexible circuit interconnect formed in accordance with the present invention.
Figure 4:
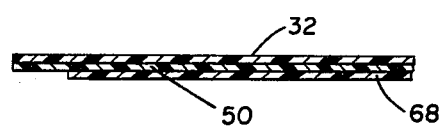
FIG. 4 is an enlarged, cross-sectional view of a portion of the interconnect of FIGS. 1 and 3 taken along line 4—4 of FIG. 3.

With reference to FIGS. 3 and 4, to protect and insulate the circuit lines 50, 52 of first portion 56 and the connectors 42, 44, a second insulating overlay film 68 is disposed over first portion 56 and a partial area of the second portion 58. The overlay film 68 seals the circuit traces not contacting piezoelectric element 12 and in addition is disposed intermediate of the element 12 and the base film 32 to an extent to avoid short-circuiting the outer contact 40 to the center contact 38 at an area where the element base contact area 26 overlaps the circuit line 50 for the center contact area 38. The overlay film 68 may be an ultraviolet curable polymer material of the same flexible material as the base film 32.

With particular reference to FIGS. 2 and 5, the interconnect 10 is connected to the element 12 in either a compression fit or by pressure sensitive adhesives such that the base contact area 26 is in operative electrical connection with the outer periphery contact 40 and the top contact area 22 is in operative electrical connection to the center contact area 38.

The invention has been described with reference to the preferred embodiment. Obviously, modifications and alterations will occur to others upon a reading and understanding of the specification. It is my intention to include all such modifications and alterations insofar as they come within the scope of the appended claims or the equivalents thereof.

Having thus described the invention, I now claim:

1. A piezoelectric assembly comprising:
a piezoelectric element and a flexible interconnect for attachment to said element; said interconnect including an insulating base and spaced circuit traces laminated to said base in operation with electrical connection to said element, said element being generally disc-shaped and including a face for said attachment, said face being operatively connected to a first of said traces about a segment of the periphery of said face and operatively connected to a second of said traces generally centrally of said face, an insulating overlay sealing said circuit traces which are not electrically connected to the element, and means for connecting said traces to an electrical circuit.

2. The piezoelectric assembly as described in claim 1 wherein said overlay is disposed intermediate of said base and a portion of said element to preclude a short circuit between said first and said second of said traces at said periphery of said face.

3. A flexible interconnect for a piezoelectric element comprising:
a first flexible insulating film having first and second portions and including spaced electrically conductive circuit traces thereon; said traces in said first portion being in electrical continuity with said second portion and said second portion being adapted to receive said piezoelectric element including at least two of said circuit traces, one of the said two disposed along the periphery of said second portion and a second of said two disposed generally centrally of said second portion; a second flexible insulating film disposed over a part of said first film to preclude a short circuit between said first and said second of said traces and means for electrically connecting said traces to an electrical circuit.

* * * * *